US007206207B2

(12) United States Patent
He

(10) Patent No.: US 7,206,207 B2
(45) Date of Patent: Apr. 17, 2007

(54) HEAT DISSIPATION DEVICE ASSEMBLY

(75) Inventor: Li He, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

(*) Notice: Subject to any disclaimer, the term of this patent is extended or adjusted under 35 U.S.C. 154(b) by 252 days.

(21) Appl. No.: 10/955,610

(22) Filed: Sep. 30, 2004

(65) Prior Publication Data

US 2005/0259405 A1 Nov. 24, 2005

(30) Foreign Application Priority Data

Apr. 29, 2004 (CN) .................... 2004 2 0045483

(51) Int. Cl.
*H02B 1/01* (2006.01)
(52) U.S. Cl. ............... 361/825; 361/686; 361/687; 361/688; 165/80.3
(58) Field of Classification Search ............... 361/709, 361/711, 686–688, 701–703; 165/80.3; 174/16.3
See application file for complete search history.

(56) References Cited

U.S. PATENT DOCUMENTS

| 4,745,456 A | 5/1988 | Clemens | 357/79 |
| 5,389,820 A * | 2/1995 | Matsuoka | 257/727 |
| 5,397,919 A | 3/1995 | Tata et al. | 257/717 |
| 6,386,274 B1 * | 5/2002 | Wang et al. | 165/80.3 |
| 6,625,021 B1 * | 9/2003 | Lofland et al. | 361/697 |
| 6,779,595 B1 * | 8/2004 | Chiang | 165/104.33 |
| 2002/0080582 A1 | 6/2002 | Chang | |

FOREIGN PATENT DOCUMENTS

| CN | 2490699 Y | 5/2002 |
| CN | 2490703 Y | 5/2002 |

* cited by examiner

*Primary Examiner*—Dean A. Reichard
*Assistant Examiner*—Hung S. Bui
(74) *Attorney, Agent, or Firm*—Morris Manning & Martin LLP; Tim Tingkang Xia, Esq.

(57) ABSTRACT

A heat dissipation device assembly includes a heat dissipation device (10) and a retaining device (20). The heat dissipation device includes a heat sink and a heat receiver (11) provided below the heat sink. The heat receiver includes an upper section (111) and a lower enlarged section (113) below the upper section. The retaining device includes a base section (22) for mounting to the upper section and pressing downwardly against the lower section. The orientation of the heat dissipation device relative to the retaining device is adjustable via a regulating structure formed between heat receiver and the retaining device.

19 Claims, 5 Drawing Sheets

HEAT DISSIPATION DEVICE ASSEMBLY

TECHNICAL FIELD

The present invention relates generally to a heat dissipation device assembly, and more particularly to a heat dissipation device assembly having a retaining device which can attach a heat sink to a heat-generating device in different orientations for optimizing cooling efficiency thereof.

BACKGROUND

Electronic devices such as central processing units (CPUs) of computers generate large amounts of heat during their normal operation. The heat must be quickly recovered to prevent the CPUs from becoming overheated or damaged due to heat. Typically, a heat sink is attached to a CPU on a circuit board to facilitate removal of heat from the CPU, and a fan unit is provided to the heat sink for circulating air across the heat sink so as to enhance the heat removal rate of the heat sink.

In order to keep the heat sink intimately contacting the CPU on the circuit board, a retaining device is usually used for attachment of the heat sink to the CPU. In most cases, the heat sink combined with the retaining device is attached to the CPU via the retaining device engaging in holes defined in the circuit board or with protrusions formed at lateral sides of a socket connecting the CPU to the circuit board Prior to the heat sink being attached to the CPU via the retaining device, the orientation of the heat sink on the CPU is predetermined and unadjustable. However, many different situations will impact on the cooling efficiency of the heat sink greatly. Examples of such situations are different layouts of components within a computer system, installation of system fans in the computer system, the locations of air intake hole and air exhaust hole defined in a computer enclosure of the computer system for circulation of air across the computer system, etc. These situations will also cause the flowing of air from the system fans to conflict with the air current from the fan unit of the heat sink within the computer enclosure. Therefore, the heat sink and the fan unit on the CPU need to be conveniently adjusted to desired orientations for purposes of dissipating heat more efficiently.

SUMMARY OF THE INVENTION

Accordingly, an object of the present invention is to provide a heat dissipation device which can be adjusted to different orientations as desire.

In order to achieve the object set out above, a heat dissipation device assembly according to an embodiment of the present invention comprises a heat dissipation device and a retaining device. The heat dissipation device comprises a heat receiver and a heat sink attached to the heat receiver. The retaining device is mounted to the heat receiver. The orientation of the heat dissipation device relative to the retaining device is adjustable via a regulating structure formed between the heat receiver and the retaining device.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
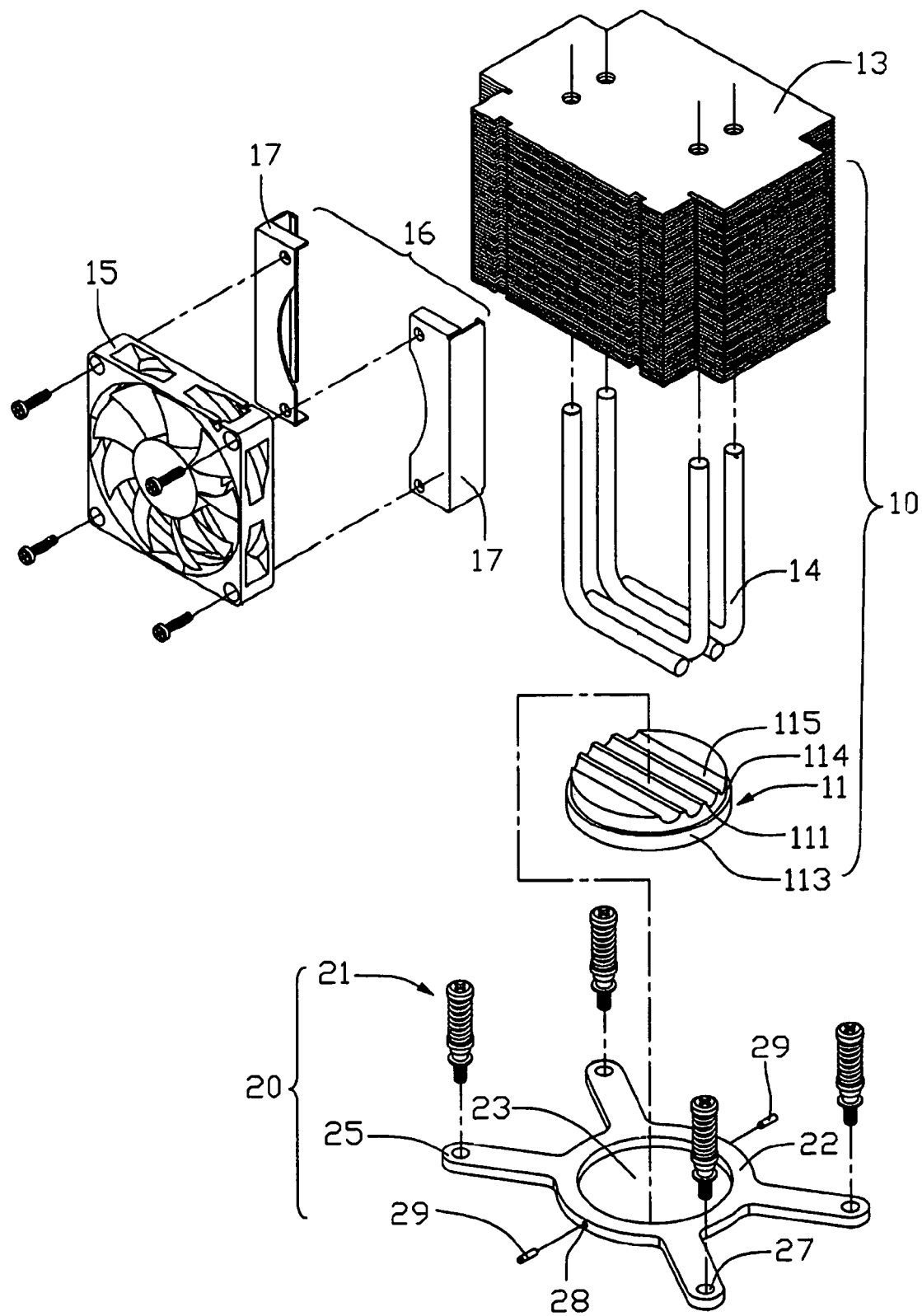
FIG. 1 is an exploded, isometric view illustrating a heat dissipation device assembly according to a first embodiment of the present invention.

Reference will now be made to the drawing figures to describe the present invention in detail.

FIG. 1 illustrates a heat dissipation device assembly according to a first embodiment of the present invention. The heat dissipation device assembly comprises a heat dissipation device 10 for cooling an electronic device (not shown) and a retaining device 20 for attaching the heat dissipation device 10 to the electronic device.

The heat dissipation device 10 includes a heat receiver 11, a heat sink located above the heat receiver 11 and a cooling fan 15 located at one side of the heat sink. The heat receiver 11 includes an upper section 111 and a lower section 113 opposing the upper section 111. The upper section 111 has around periphery. The lower section 113 has a larger dimension than that of the upper section 111. Thus, an annular step 114 forms between the periphery of the upper and lower sections 111, 113. The lower section 113 has a bottom surface for contacting the electronic device. The upper section 111 has an upper surface defined with a plurality of parallel grooves 115. The heat sink comprises a plurality of fins 13 and four L-shaped heat pipes 14. The fins 13 are spaced and parallel to each other with channels (not labeled) formed therebetween.

The retaining device 20 includes four fasteners 21 and a hollow base section 22 defined with an opening 23 at a center thereof. The base section 22 has a loop structure. Four extension arms 25 extend outwardly and radially from the base section 22. Each of the extension arms 25 has an aperture 27 defined at a distal end thereof for receiving a fastener 21. The fasteners 21 are screws, push-pin clips having barbs formed at distal ends thereof, or other similar structure. Two holes 28 are defined transversally through two opposite lateral sides of the base section 22 respectively. Each of the holes 28 is for receiving a pin 29 or similar structures such as a stud.

Figure 2:
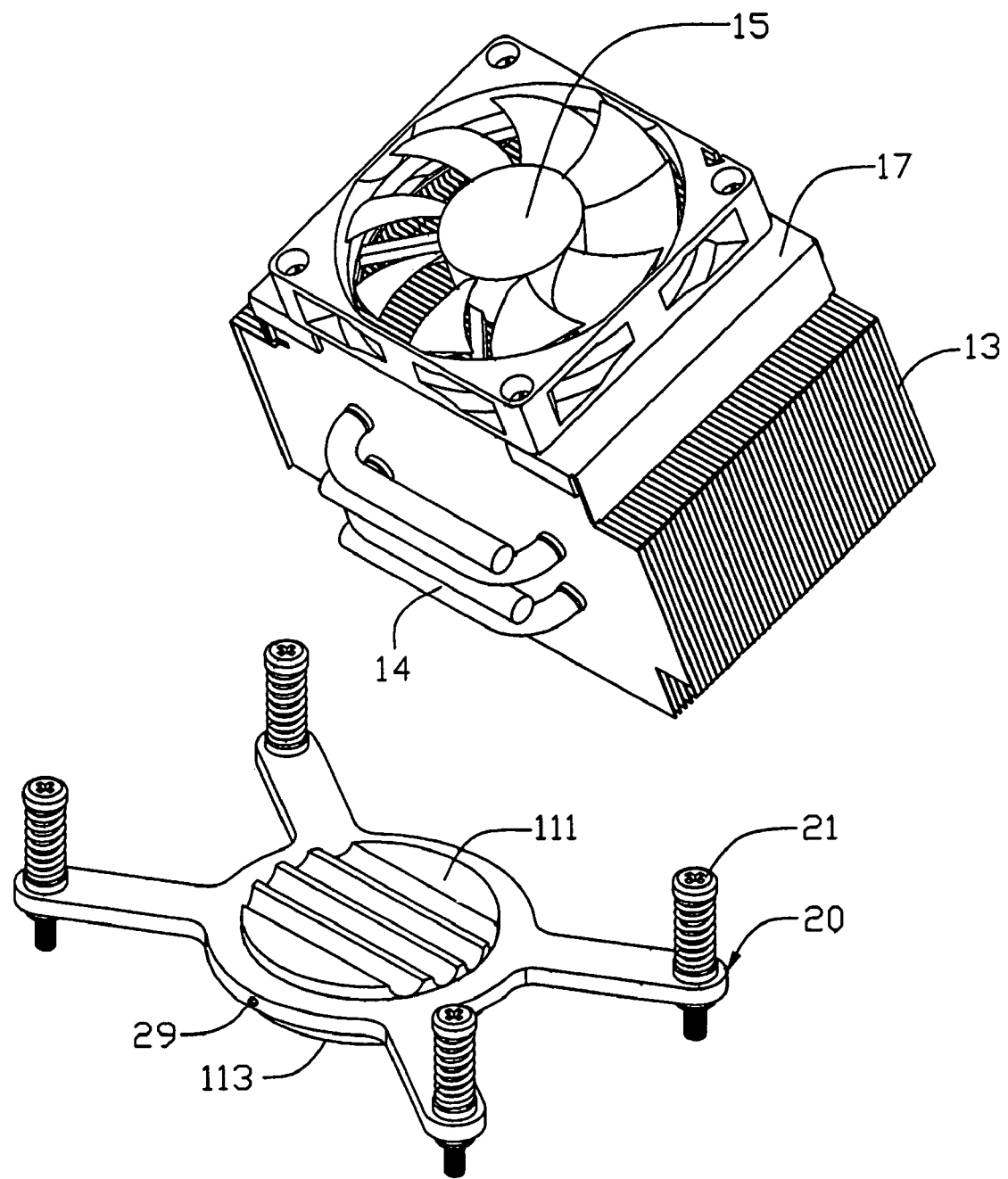
FIG. 2 is a pre-assembled view of FIG. 1.
Figure 3:
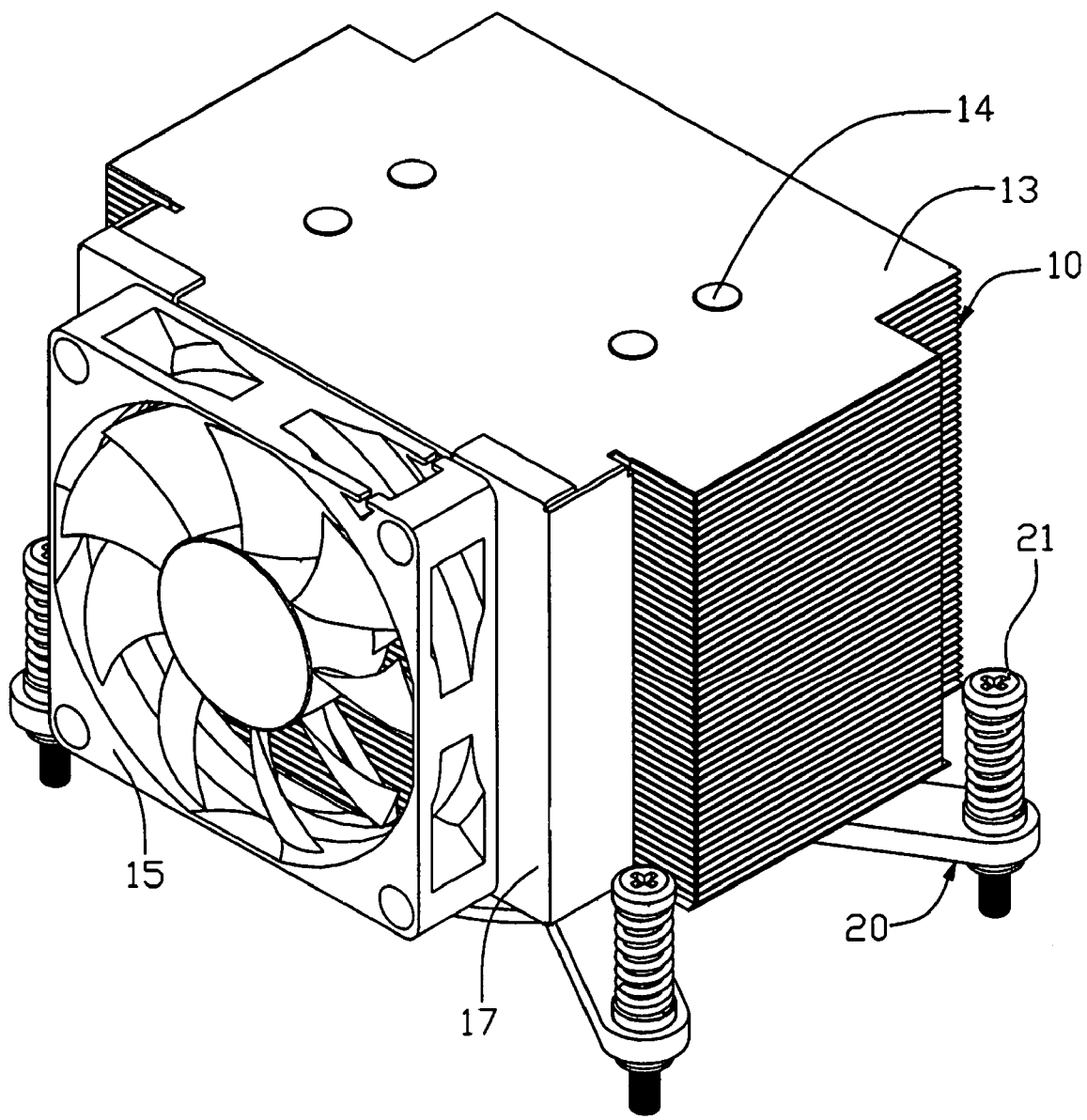
FIG. 3 is an assembled view of FIG. 1.

Referring also to FIG. 2 and FIG. 3, when assembled, the base section 22 of the retaining device 20 is mounted to and surrounds the upper section 111 of the heat receiver 11 and is supported by the step 114. The fasteners 21 extend through the apertures 27 of the extension arms 25 to thereby connect to the base section 22. The pins 29 are received in the holes 28 of the base section 22 and abut against the periphery of the upper section 111, thereby holding the base section 22 and the upper section 111 together. The fins 13 stack along the heat pipes 14 with one end of each heat pipe 14 extending through a hole (not labeled) defined in the fins 13. The other end of each heat pipe 14 extends below the fins 13 for being received in a corresponding groove 115 of the upper section 111. The cooling fan 15, for generating airflow through the channels between the fins 13, is attached to one side of the fins 13 via a fan holder 16 consisting of two locking brackets 17. When used, the heat dissipation device 10 is attached to the electronic device for heat dissipation via the fasteners 21 of the retaining device 20 engaging with a circuit board (not shown) on which the electronic device is installed. At the same time, the base section 22 is pressed downwardly against the step 114 of the heat receiver 11 to cause the heat receiver 11 to intimately contact with the electronic device.

Figure 4:
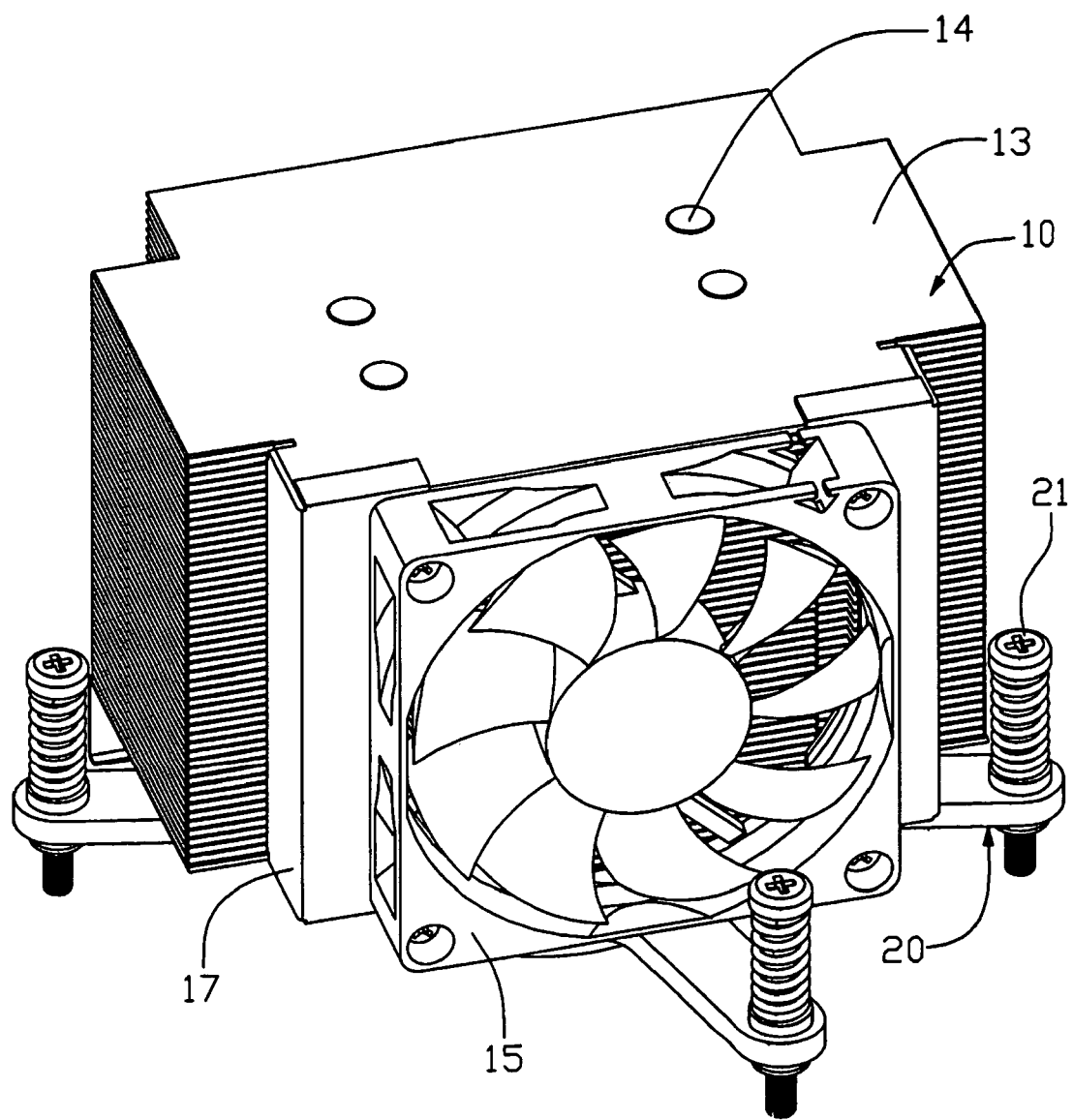
FIG. 4 is similar to FIG. 3, but showing the heat dissipation device located in another orientation relative to the retaining device.

According to different situations, as discussed above, in which the heat dissipation device 10 is desired to be adjusted to different orientations for purposes of dissipating heat more efficiently, the heat dissipation device 10 is regulated relative to the retaining device 20 before attached to the electronic device via loosening the pin 29 and turning around the heat dissipation device 10 relative to the retaining device 20. As shown in FIG. 4, the heat dissipation device 10 is regulated to another orientation relative to the retaining device 20 different from FIG. 3. Thus, the direction of the airflow from the fan 15 and the directions of the channels between the fins 13 are changed relative to the retaining device 20 in order to meet the overall airflow consideration of a computer system.

Figure 5:
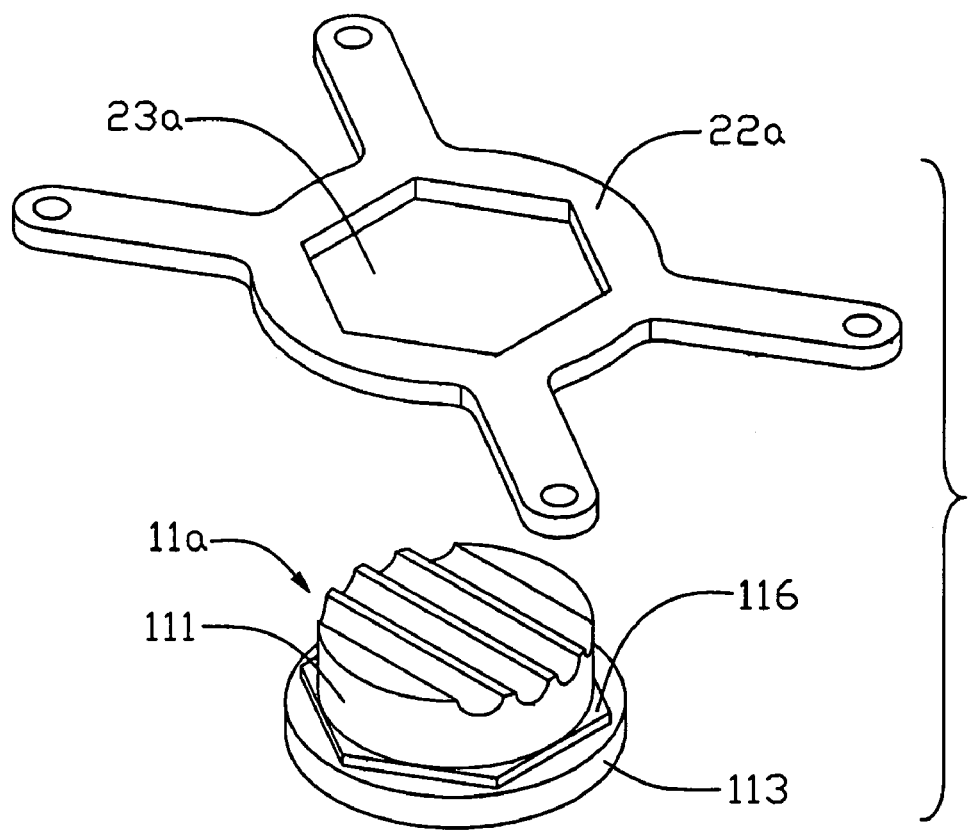
FIG. 5 is an isometric view illustrating portions of a heat dissipation device assembly according to a second embodiment of the present invention.

FIG. 5 illustrates portions of a heat dissipation device assembly according to a second embodiment of the present invention The base section 22a and the heat receiver 11a are similar to the base section 22 and the heat receiver 11 of the first embodiment except that the base section 22a defines a polygonal opening 23a and the heat receiver 11a has a polygonal middle section 116 formed between the lower section 113 and the upper section 111. The base section 22a can be mounted to the upper section 111 in different orientation relative to the heat receiver 11a via the middle section 116 cooperating with the polygonal opening 23a.

Figure 6:
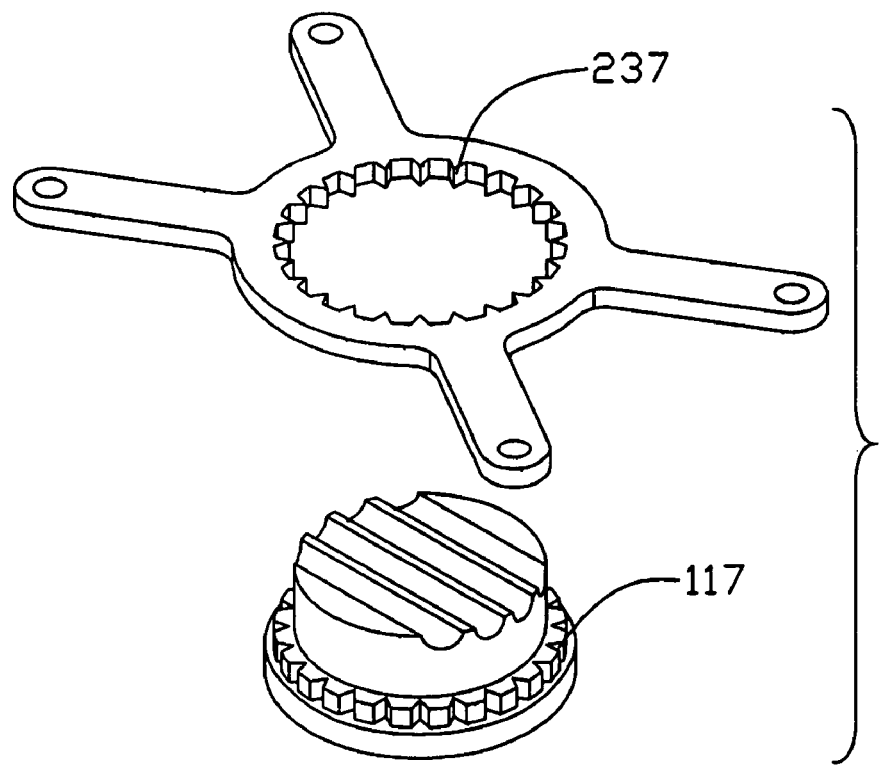
FIG. 6 is an isometric view illustrating portions of a heat dissipation device assembly according to a third embodiment of the present invention.

FIG. 6 illustrates portions of a heat dissipation device assembly according to a third embodiment of the present invention. FIG. 6 is similar to FIG. 5, except that the middle section 116 and the polygonal opening 23a in FIG. 5 are substituted by a middle protrusion with plural of male teeth 117 and a hole having female teeth 237.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device assembly comprising:
a heat receiver having an upper section and a lower section opposing to said upper section,
a step formed between said upper and lower sections;
a heat sink comprising at least one heat pipe attached to said upper section of said heat receiver and spaced from a bottom surface of said lower portion by a distance, and a plurality of fins attached to said heat pipe; and
a retaining device including a hollow base section attachably surrounding said upper section of said heat receiver and abutting against said step before said heat pipe is attached to said heat receiver;
wherein the orientation of said heat sink relative to said retaining device is adjustable within an angle smaller than 90 degrees via a regulating structure formed between said heat receiver and said retaining device, said retaining device is held between said heat sink and said step, and said upper section defines at least one groove, and a portion of said heat pipe extends out of the fins and is received in the groove.

2. The heat dissipation device assembly of claim 1, wherein said heat pipe is L-shaped.

3. The heat dissipation device assembly of claim 1, wherein said regulating structure comprises a hole defined in said base section and a pin extending through the hole for engaging a round periphery of said upper section of said heat receiver.

4. The heat dissipation device assembly of claim 1, wherein said regulating structure comprises a polygonal opening defined in said base section and a corresponding polygonal middle section formed between said upper and lower sections of said heat receiver.

5. The heat dissipation device assembly of claim 1, wherein said regulating structure comprises a hole having plural of female teeth and a middle protrusion with plural of male teeth between said upper and lower sections of said heat receiver.

6. The heat dissipation device assembly of claim 1, wherein said base section has plural of extension arms extending outwardly and radially therefrom.

7. The heat dissipation device assembly of claim 6, wherein said retaining device further comprises, plural of fasteners and each of said extension arms defines an aperture at a distal end thereof for receiving one of the fasteners.

8. The heat dissipation device assembly of claim 1, further comprising a cooling fan provided a one side of the heat sink.

9. A heat dissipation device assembly comprising:
a heat receiver;
a retaining device mounted to said heat receiver and comprising a plurality of extension arms for extension of fasteners therethrough; and
a heat sink attached to said heat receiver, the heat sink having a plurality of fins with channels formed thereberween;
wherein a regulating structure is formed between said retaining device and said heat receiver and is capable of adjusting the orientation of said heat receiver relative to said retaining device to thereby adjust directions of the channels of the hear sink;
wherein after the orientation of said heat receiver relative to said retaining device is adjusted, said regulating structure is capable of locking said heat receiver relative to said retaining device before said heat dissipation device assembly is mounted on a heat source.

10. The heat dissipation device assembly of claim 9, wherein said hear sink includes at least one heat pipe attached to said heat receiver, and said fins are stacked along the heat pipe.

11. The heat dissipation device assembly of claim 9, wherein said retaining device comprises a base section from which said extension arms extend.

12. The heat dissipation device assembly of claim 11, wherein said heat receiver comprises an upper section and a lower section opposing to the upper section, said upper and lower section forming a step therebetween and said base section being attachably mounted to the upper section and abutting against the step.

13. The heat dissipation device assembly of claim 12, wherein said regulating structure comprises a hole defined in said base section and a pin extending through the hole for engaging a round periphery of said upper section.

14. The heat dissipation device assembly of claim 12, wherein said regulating structure comprises a polygonal opening defined in said base section and a corresponding polygonal middle section formed between said upper and lower sections.

15. The heat dissipation device assembly of claim 12, wherein said regulating structure comprises a hole having plural of female teeth and a middle protrusion with plural of male teeth between said upper and lower sections.

16. The heat dissipation device assembly of claim 9, further comprising a cooling fan coupled to one side of the heat sink by means of a holder.

17. A heat dissipation device assembly comprising:
a heat dissipation device including a heat receiver comprising a bottom face and a top face opposing the bottom face, and a heat sink attached to the top face of the heat receiver;
a fan coupled to one side of said heat sink for generating airflow therethrough; and
a retaining device capable of being mounted to said heat receiver before said heat sink is attached to said heat receiver;
wherein the orientation of the airflow relative to said retaining device is adjustable via adjusting the orientation of the heat receiver relative to the retaining device; and
wherein the retaining device comprises a male structure formed thereon and a female structure formed on the heat receiver for engaging with the male structure, the orientation of the heat receiver relative to the retaining device is adjusted via adjusting relative location relation between the male structure and the female structure before the heat receiver is locked relative to the retaining device via the engagement between the male structure and the female structure.

18. The heat dissipation device assembly of claim 17, wherein the heat sink comprises a plurality of fins and at least one heat pipe connecting the fins with said heat receiver.

19. The heat dissipation device assembly of claim 18, wherein the retaining device comprises a base section attachably surrounding the heat receiver, and a plurality of extension arms each defining an aperture for extension of a fastener.

* * * * *